United States Patent
Liu et al.

(10) Patent No.: US 8,884,374 B2
(45) Date of Patent: Nov. 11, 2014

(54) CMOS DEVICE AND FABRICATION METHOD

(71) Applicants: Leo Liu, Shanghai (CN); Allan He, Shanghai (CN)

(72) Inventors: Leo Liu, Shanghai (CN); Allan He, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/744,864

(22) Filed: Jan. 18, 2013

(65) Prior Publication Data

US 2014/0015065 A1    Jan. 16, 2014

(30) Foreign Application Priority Data

Jul. 12, 2012  (CN) .......................... 2012 1 0241586

(51) Int. Cl.
- *H01L 21/70* (2006.01)
- *H01L 21/8238* (2006.01)
- *H01L 27/092* (2006.01)
- *H01L 21/02* (2006.01)

(52) U.S. Cl.
CPC .. *H01L 21/02697* (2013.01); *H01L 21/823842* (2013.01); *H01L 27/092* (2013.01); *H01L 21/823857* (2013.01)

USPC .......................................... 257/369; 438/199

(58) Field of Classification Search
USPC ......... 438/141, 153–154, 199, 201, 241, 159, 438/163

See application file for complete search history.

(56) References Cited

U.S. PATENT DOCUMENTS

| | | | |
|---|---|---|---|
| 7,241,700 B1 * | 7/2007 | En et al. ..................... | 438/745 |
| 7,575,991 B2 * | 8/2009 | Doczy et al. ................ | 438/591 |
| 2007/0032008 A1 * | 2/2007 | Kim et al. ................... | 438/199 |
| 2009/0098737 A1 * | 4/2009 | Doris et al. ................. | 438/742 |
| 2009/0206416 A1 * | 8/2009 | Cheng et al. ............... | 257/369 |
| 2011/0081753 A1 * | 4/2011 | Yamanari et al. .......... | 438/216 |
| 2012/0061773 A1 * | 3/2012 | Tsuchiya ..................... | 257/411 |

* cited by examiner

*Primary Examiner* — Julio J Maldonado
*Assistant Examiner* — Moin Rahman
(74) *Attorney, Agent, or Firm* — Anova Law Group, PLLC (57) ABSTRACT

Various embodiments provide complementary metal-oxide-semiconductor (CMOS) devices and their fabrication methods. A semiconductor substrate is provided to include a first region to form a PMOS transistor and a second region to form an NMOS transistor. One of the first and second regions can include a metal gate structure having a metal top layer. The other of the first and second regions can include an interfacial oxide layer formed on a high-k dielectric layer. A surface of the metal top layer can be oxidized to form a metal oxide top layer covering the metal top layer. The metal oxide top layer and the interfacial oxide layer can be removed by wet etching. A metal gate can be formed on the high-k dielectric layer.

18 Claims, 12 Drawing Sheets

FIG. 1

(PRIOR ART)

FIG. 2

(PRIOR ART)

CMOS DEVICE AND FABRICATION METHOD

CROSS-REFERENCES TO RELATED APPLICATIONS

This application claims the priority of Chinese Patent Application No. 201210241586.1, filed on Jul. 12, 2012, which is incorporated herein by reference in its entirety.

FIELD OF THE INVENTION

The present disclosure relates to the field of semiconductor manufacturing technology and, more particularly, relates to complementary metal-oxide-semiconductor (CMOS) devices and methods for making the same.

BACKGROUND

With development of semiconductor technology, semiconductor devices are reduced in size. For example, as CMOS devices shrink to 45 nm, the gate dielectric materials may have an equivalent-oxide-thickness (EOT) of about 1 nm. High-k dielectric materials have been investigated to replace conventional gate oxide layers due to excellent current-leakage reduction seen when using the high-k dielectric materials at the same EOT. For devices small in size, it is desirable to use gate structure having a metal gate and high-k dielectric layer, instead of using polysilicon gate and low-k silicon oxide dielectric layer.

Conventional methods for forming metal gates include a gate-first process, and a gate-last process. In a gate-last process, a dummy gate is deposited and then removed after silicide formation at source/drain regions. Metals may then be filled to form a metal gate. Problems arise, however, because an undesired interfacial oxide layer is formed on the exposed surface after an NMOS (or PMOS) dummy gate is removed. This oxide layer is hard to remove because an aluminum (Al) film is exposed at the PMOS (or NMOS) region. Aluminum (Al) can be etched by both acid and alkali. Conventional etching processes used to remove interfacial oxide may also remove the PMOS Al and cause PMOS Al loss.

Figure 1:
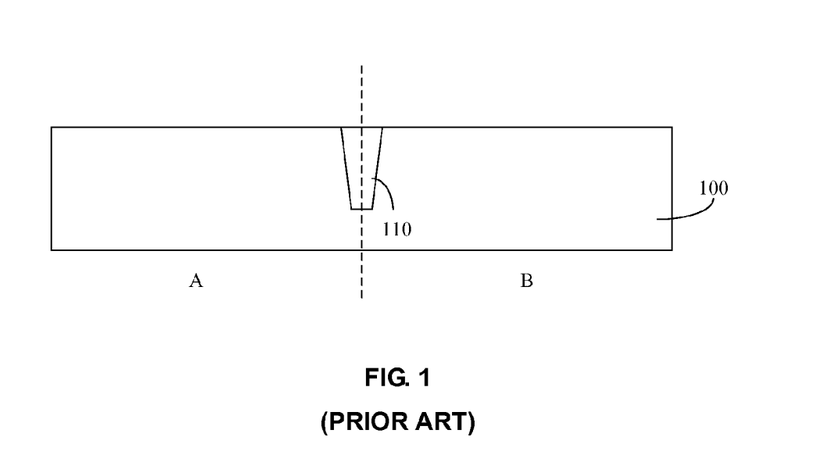
FIG. 1 through FIG. 8 are schematics of intermediate structures during formation of a conventional CMOS device.

Existing methods for forming a metal gate structure in CMOS devices are shown in FIGS. 1-8. In FIG. 1, a semiconductor substrate 100 can include a region A (e.g., for forming an NMOS therein) and a region B (e.g., for forming a PMOS region). The semiconductor substrate 100 also includes an isolation region 110 for separating doped regions of the transistors.

Figure 2:
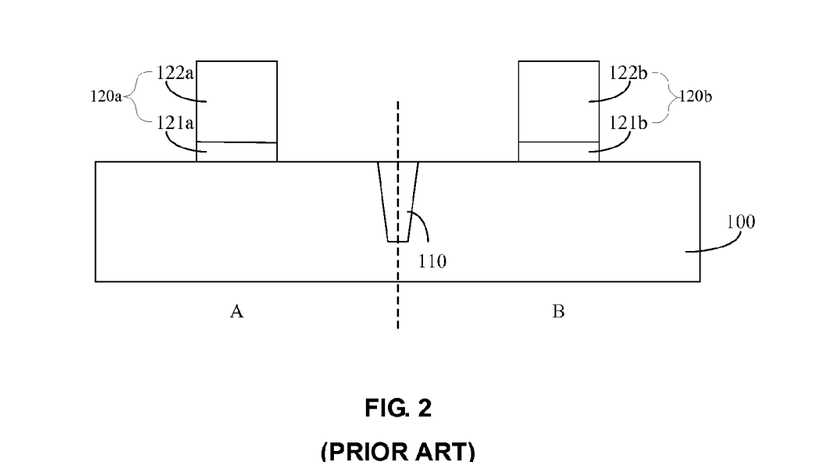

In FIG. 2, polysilicon dummy gate structures 120a and 120b are formed on the semiconductor substrate 100. The polysilicon dummy gate structure 120a, associated with the region A for forming an NMOS transistor, includes a high-k dielectric layer 121a and a polysilicon dummy gate 122a. This defines the size and position of subsequently formed metal gate structure of the NMOS transistor. The polysilicon dummy gate 122a is to be replaced by a metal gate of the NMOS transistor.

The polysilicon dummy gate structure 120b, associated with the region B for forming a PMOS transistor, includes a high-k dielectric layer 121b and a polysilicon dummy gate 122b. This defines the size and position of subsequently formed metal gate structure of the PMOS transistor. The polysilicon dummy gate 122b is to be replaced by a metal gate of the PMOS transistor.

Figure 3:
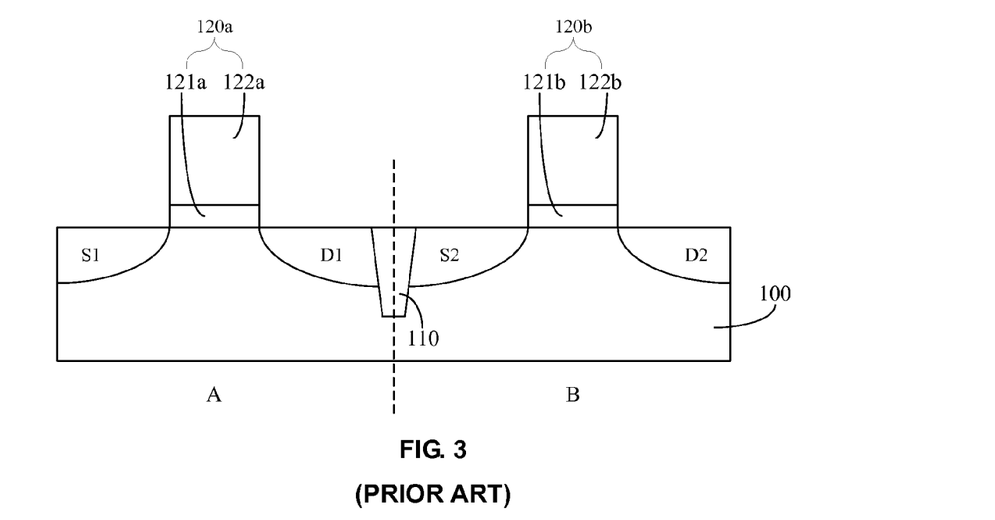

In FIG. 3, source region S1 and drain region D1 for an NMOS transistor are formed in region A. Source region S2 and drain region D2 for a PMOS transistor are formed in region B. Source regions and drain regions can be formed by various ion implantations in the substrate 100, depending on the types of each MOS transistor to be formed.

Figure 4:
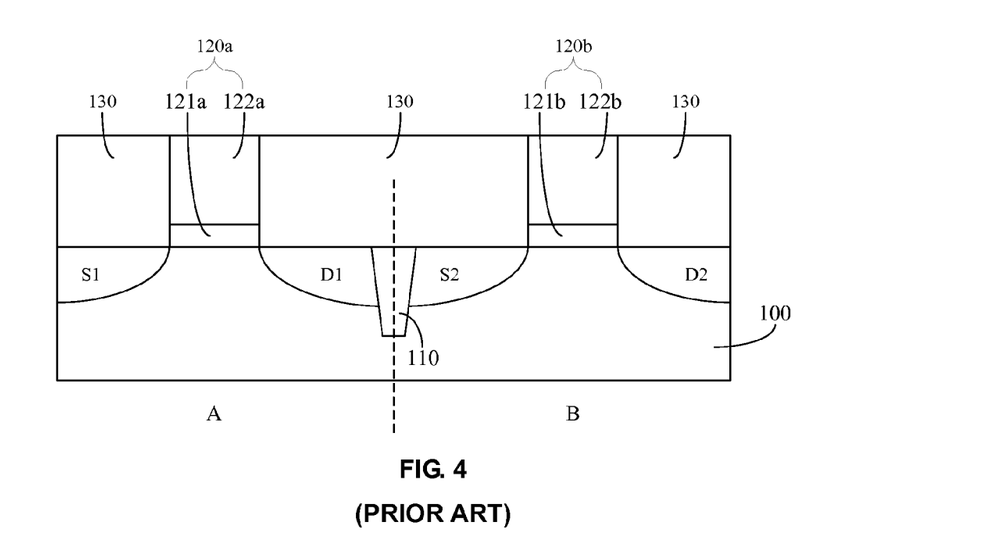

In FIG. 4, a dielectric layer 130 is formed covering the semiconductor substrate 100. The dielectric layer 130 is flushed with the polysilicon dummy gate structures 120a and 120b. The dielectric layer 130 is formed by depositing a dielectric material, followed by a chemical mechanical polishing (CMP) process.

Figure 5:
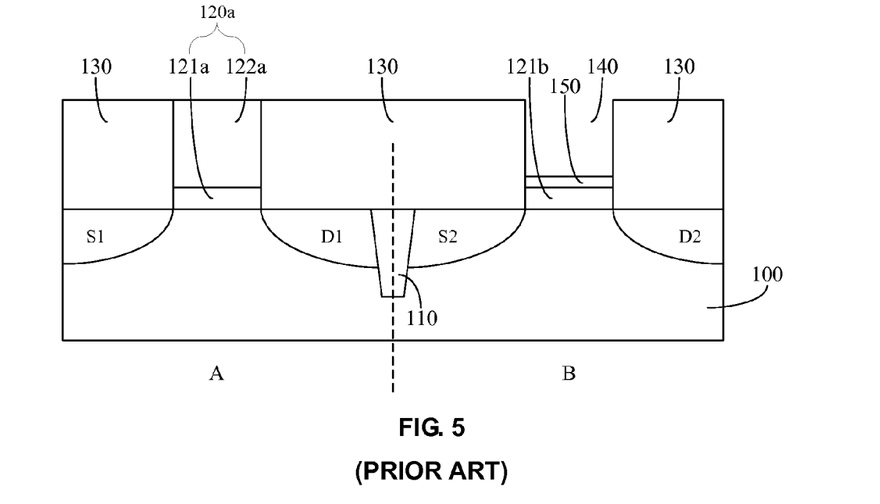

In FIG. 5, the polysilicon dummy gate 122b is removed by a wet etching process to form an opening 140. A metal gate is subsequently formed in the opening 140. When forming the opening 140 and the metal gate for the PMOS transistor, the region A for forming NMOS is covered by a protective layer (not illustrated in the figure). The protective layer is formed by standard photolithography.

An interfacial oxide layer 150 may be formed in the opening 140 and on the high-k dielectric layer 121b during or after removal of the polysilicon dummy gate 122b. The interfacial oxide layer 150 may also be formed during previous formation of the polysilicon dummy gate 122b by polysilicon oxidization, often at high temperatures.

Figure 6:
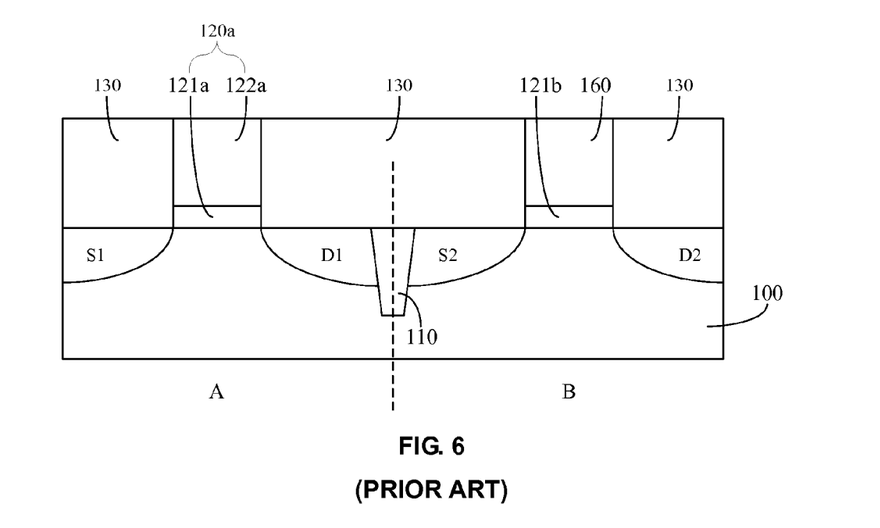

In FIG. 6, the interfacial oxide layer 150 is removed. The high-k dielectric layer 121b is exposed. A metal gate 160 is formed on the high-k dielectric layer 121b for the PMOS transistor. The metal gate 160 includes a multi-layered metal. The multi-layered metal includes a top layer and a work function layer. The top layer may be formed by aluminum. The PMOS transistor is then formed including a gate structure with metal gate 160 on the high-k dielectric layer 121b.

Figure 7:
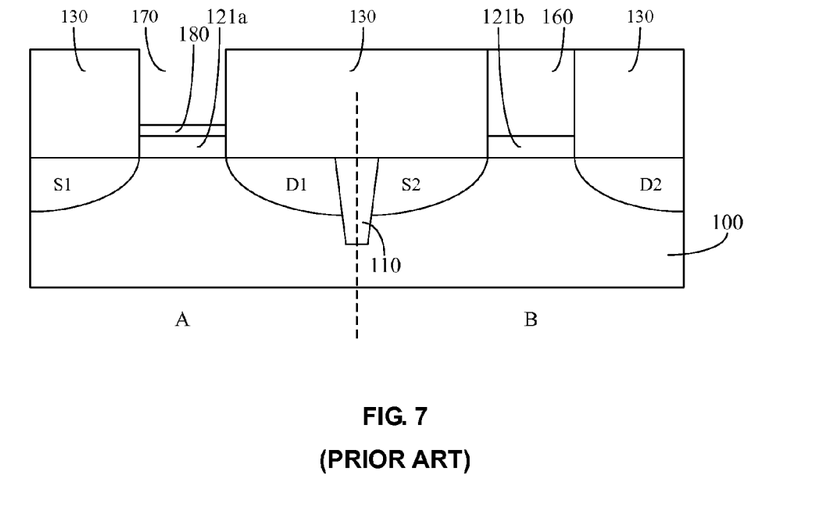

In FIG. 7, once the metal gate structure has formed for the PMOS transistor, the protective layer on the polysilicon dummy gate 122a for NMOS transistor is removed from region A. A second protective layer (not illustrated in the figure) is formed to cover and protect the formed metal gate structure of the PMOS transistor in region B. The second protective layer is formed by photolithography.

An opening 170 is formed after removal of the polysilicon dummy gate 122a in region A for the PMOS transistor. Likewise, an interfacial oxide layer 180 is formed at the bottom of the opening 170.

Figure 8:
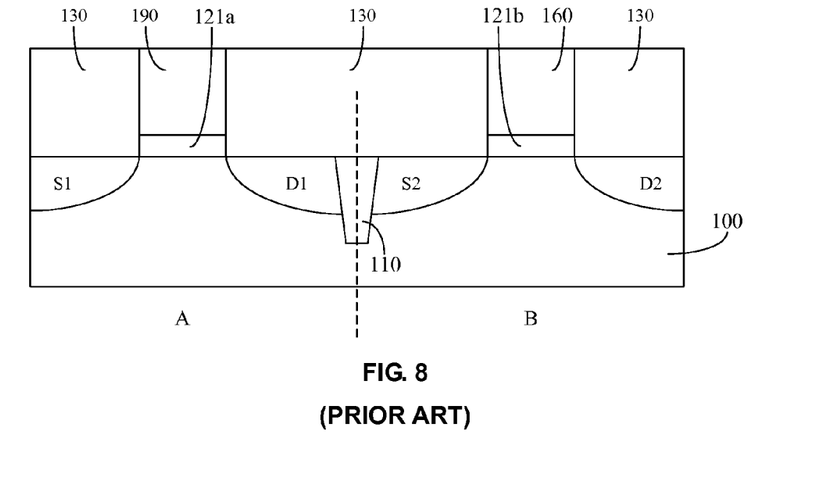

In FIG. 8, after the interfacial oxide layer 180 is removed, a metal gate 190 is formed for the NMOS transistor. The metal gate structure for NMOS transistor therefore includes the metal gate 190 on the high-k dielectric layer 121a.

As described above, photolithographic processes are used at least twice to cover one of regions A and B, when processing the other of regions A and B. Generally, photolithographic processes involve complex alignment techniques with high manufacturing cost. However, if the photolithographic processes were not used, the removing of interfacial oxide layer in the NMOS transistor will unduly damage the top layer of the already-formed metal gate of the PMOS transistor.

Thus, there is a need to overcome these and other problems of the prior art and to provide CMOS devices and fabrication methods without using photoresists as protective layers and without unduly damaging the surrounding structures that are formed in a CMOS process flow.

BRIEF SUMMARY OF THE DISCLOSURE

One aspect of the present disclosure includes a method for fabricating a complementary metal-oxide-semiconductor (CMOS) device. In this method, a semiconductor substrate can be provided including a first region to form a PMOS transistor and a second region to form an NMOS transistor.

One of the first and second regions can include a metal gate structure including a metal top layer. The other of the first and second regions can include an interfacial oxide layer formed on a high-k dielectric layer. A surface of the metal top layer can be oxidized to form a metal oxide top layer covering the metal top layer. The metal oxide top layer and the interfacial oxide layer can then be removed by wet etching, followed by forming a metal gate on the high-k dielectric layer.

Another aspect of the present disclosure includes a complementary metal-oxide-semiconductor (CMOS) device. The CMOS device can include a semiconductor substrate including a first region for a PMOS transistor and a second region for an NMOS transistor. The CMOS device can also include a first metal gate structure formed on the first region including a first high-k dielectric layer and a first metal gate containing a metal top layer over the first high-k dielectric layer. The CMOS device can further include a second metal gate structure formed on the second region including a second high-k dielectric layer and a second metal gate over the second high-k dielectric layer. The second metal gate is formed after forming the first metal gate structure by oxidizing a surface of the metal top layer to form a metal oxide top layer covering the metal top layer; wet etching to remove the metal oxide top layer and an interfacial oxide layer on the second high-k dielectric layer; and forming the second metal gate on the second high-k dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Various embodiments provide complementary metal-oxide-semiconductor (CMOS) devices and methods for forming the same. As disclosed, a metal gate can be formed without using photoresists as protective layers. Manufacturing costs can be reduced.

In one embodiment, a semiconductor substrate is provided to include a first region to form a PMOS transistor and a second region to form an NMOS transistor. The first region (or second region) can include a metal gate structure including a metal top layer. The second region (or first region) can include an interfacial oxide layer formed on a high-k dielectric layer. A surface of the metal top layer in the first region can be oxidized to form a metal oxide top layer covering the metal top layer. The metal oxide top layer in the first region and the interfacial oxide layer in the second region can then be removed by wet etching. As the interfacial oxide layer is removed from the high-k dielectric layer, a metal gate can be formed on the high-k dielectric layer.

As disclosed herein, by oxidizing surface of the metal top layer to form the metal oxide top layer, the metal top layer can be protected without using photoresists, while the interfacial oxide layer is processed, e.g., wet etched. Photolithographic processes are avoided and less metal material of the metal top layer is consumed.

In one embodiment, the steps of oxidizing and wet etching can be performed by only once, i.e., by one single oxidation process to oxide the top surface of the metal top layer and by one single wet etching process to remove the interfacial oxide layer and the formed metal oxide top layer, to have minimal process steps and improve manufacturing efficiency.

In another embodiment, the steps of oxidizing and wet etching can be repeated by multiple times to remove the interfacial oxide layer and to avoid over-etching and any adverse effects (e.g., damage) on the top metal layer.

In yet another embodiment, the sequence of the steps of oxidizing and wet etching can be altered. For example, the interfacial oxide layer can be partially removed by wet etching, which can be followed by oxidization of the metal top layer. Then, at least a portion of the remaining interfacial oxide layer can be removed by wet etching.

As disclosed herein, the metal gate structure can include a high-k dielectric layer and a metal gate on the high-k dielectric layer. The metal gate can be a single metal layer or a multi-metal layer. When a single metal layer is used for the metal gate, the metal top layer of the metal gate structure is the single metal layer. When a multi-metal layer is used for the metal gate, the metal top layer is a top layer of the multi-metal layer.

For ease of illustration, various embodiments are described with reference to a manufacturing process for forming a CMOS device having a metal gate structure including a metal top layer made of aluminum. Any other suitable metal or metal alloys can also be used.

In addition, the exemplary CMOS device may be fabricated by forming a PMOS transistor prior to forming an NMOS transistor. Alternatively, the PMOS transistor can be formed following formation of the NMOS transistor.

Further, the various embodiments are described using a gate-last process as an example for forming PMOS and/or NMOS transistors. One of ordinary skill in the art would understand that a gate-first process or other possible processes can be encompassed in the various embodiments to form PMOS and/or NMOS transistors as desired.

Figure 9:
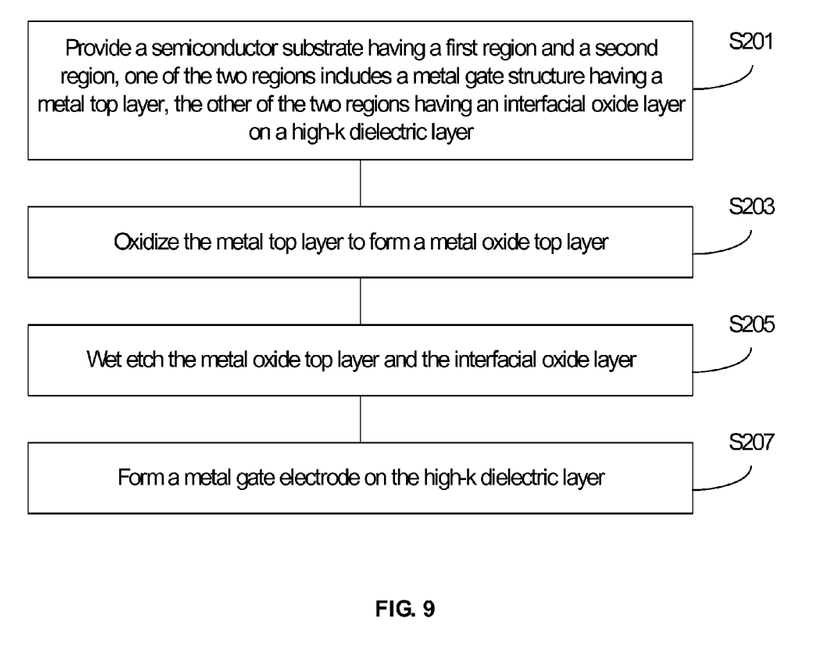
FIG. 9 is a schematic flow diagram showing an exemplary method for forming a CMOS device in accordance with various disclosed embodiments.

FIG. 9 depicts an exemplary fabrication process for forming a CMOS device, and FIGS. 10-13 depict exemplary semiconductor structures of the CMOS device corresponding to various stages of the fabrication process depicted in FIG. 9.

Figure 10:
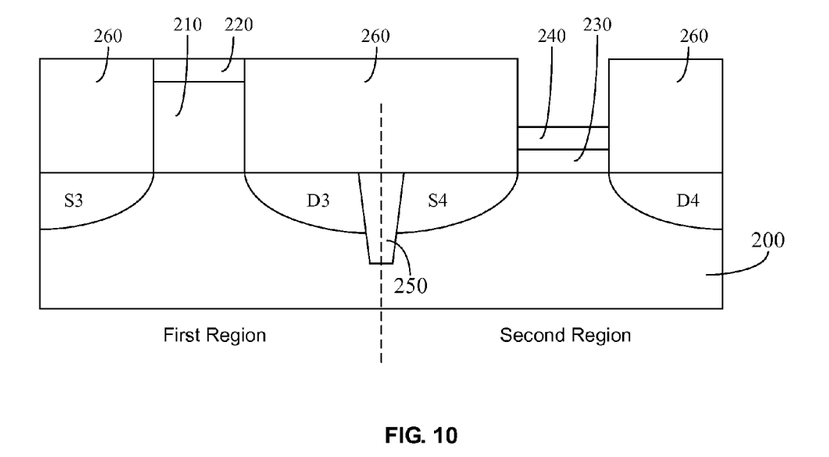
FIG. 10 through FIG. 13 are schematics of an exemplary CMOS device at various stages during formation in accordance with various disclosed embodiments.

As shown in FIG. 9, at the beginning of the fabrication process, at step S201, a semiconductor substrate is provided. FIG. 10 shows a corresponding semiconductor substrate 200. The semiconductor substrate 200 can include a first region, e.g., for forming a PMOS (or an NMOS) transistor, and a second region, e.g., for forming an NMOS (or a PMOS) transistor.

As shown in FIG. 10, the first region (e.g., for forming a PMOS transistor) can include a source region S3 and a drain region D3. The second region (e.g., for forming an NMOS transistor) can include a source region S4 and a drain region D4. An isolation structure 250 is formed between the first region and the second region. The isolation structure 250 can include a shallow trench isolation structure, or any other isolation structures. A dielectric layer 260 can also be formed on the substrate 200.

In the first region of FIG. 10, a metal gate structure 210 has been formed. The already-formed metal gate structure 210 may include, for example, a high-k dielectric layer (not illustrated), a work function layer (not illustrated), and a metal top layer such as an aluminum (Al) top layer 220.

In the second region of FIG. 10, an interfacial oxide layer 240 has been formed on a high-k dielectric layer 230. Generally, the interfacial oxide layer 240 may include any possible oxide material generated during device fabrication. The present disclosure will be described using silicon oxide as an example. The interfacial oxide layer 240 is undesired and needs to be removed before forming any metal gate over the high-k dielectric layer 230. Although the interfacial oxide layer 240 in the second region is removed when the metal gate structure 210 and/or various source/drain regions have been formed, the interfacial oxide layer 240 can be removed at any stage of the fabrication process.

Figure 11:
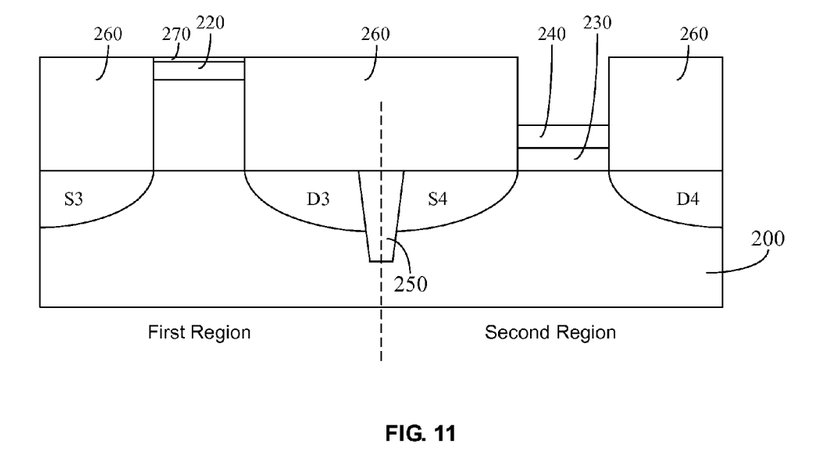

At step S203 of FIG. 9, instead of forming the protection layer on the already-formed Al top layer 220 to process (e.g., etch away) the interfacial oxide layer 240, the Al top layer 220 is treated by an oxidation process. For example, a surface of the Al top layer 220 can be oxidized to form a metal oxide top layer covering the Al top layer 220. FIG. 11 shows a corresponding structure having a metal oxide top layer such as an alumina ($Al_2O_3$) top layer 270, covering the Al top layer 220 of the metal gate structure in the first region.

In one embodiment, the alumina ($Al_2O_3$) top layer 270 can be formed by treating the Al top layer 220 with an oxygen-containing gas at a desired temperature. For example, the Al top layer 220 can be heated and treated by passing an oxygen-containing gas mixture, so that the top surface of the Al top layer 220 reacts with oxygen to form the $Al_2O_3$ top layer 270. In one example, the oxygen-containing gas mixture can be a mixture of oxygen and nitrogen.

The $Al_2O_3$ top layer 270 can have a controllable thickness, e.g., by controlling the oxidization process including, for example, the heating temperature and the treatment time, etc. The $Al_2O_3$ top layer 270 can have a thickness that is sufficiently large to protect the underlying Al top layer 220 from being etched in a subsequent wet etching process when removing the interfacial oxide layer 240. On the other hand, the $Al_2O_3$ top layer 270 can have a thickness that is sufficiently small such that when the $Al_2O_3$ top layer 270 needs to be removed (e.g., etched away), it can be completely removed without leaving $Al_2O_3$ residues on the Al top layer 220 to affect (e.g., reduce) device performance.

When the $Al_2O_3$ top layer 270 and the interfacial oxide layer 240 are to be removed at one step, the thickness of the metal oxide top layer can also be determined based on the thickness of the interfacial oxide layer 240, and its etching conditions. In one example, the thickness of the interfacial oxide layer 240 to be removed can be approximately 10 Å. Accordingly, the Al top layer 220 can be oxidized at a temperature ranging from about 0° C. to about 300° C. for a time length ranging from about 1 second to about 600 seconds to form the $Al_2O_3$ top layer 270 having a thickness ranging from about 5 Å to about 200 Å.

Figure 12:
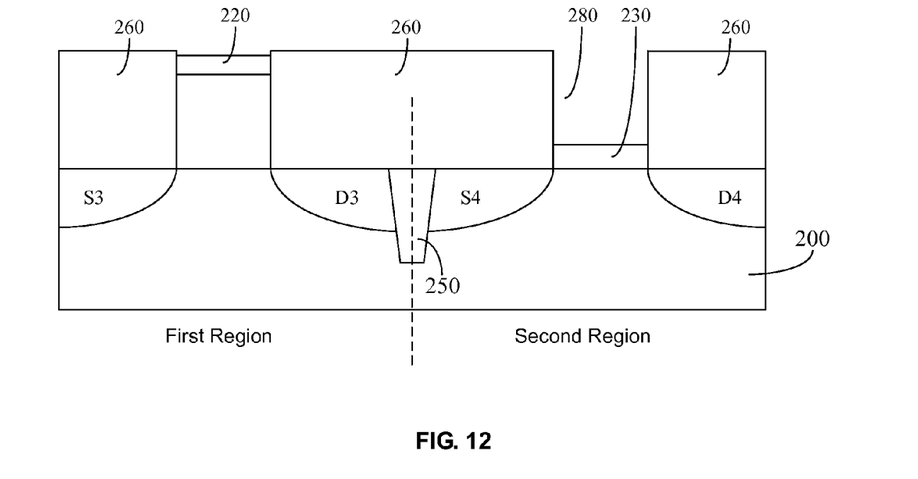

Referring to step S205 of FIG. 9, an exemplary wet etching process can be performed to remove the $Al_2O_3$ top layer 270 in the first region and the interfacial oxide layer 240 in the second region. For example, a dilute hydrofluoric acid (HF) solution can be used as a wet etchant to remove the $Al_2O_3$ top layer 270 and the interfacial oxide layer 240. FIG. 12 depicts a corresponding structure after removal of the $Al_2O_3$ top layer 270 and the interfacial oxide layer 240.

Dilute HF solutions can have a lower etch rate to metal oxide $Al_2O_3$ than to metal Al. In one example, a dilute HF solution having a molar ratio of HF:$H_2O$ for about 1:1000 can be used to etch an alumina ($Al_2O_3$) layer having a thickness of 20 Å disposed on an aluminum (Al) layer. It is observed that about 14 Å thick alumina ($Al_2O_3$) is etched away after 10 seconds. When the etching process is continued for an additional 10 seconds, a thickness of about 86 Å is further removed. That is, a thickness of about 6 Å of the remaining $Al_2O_3$ and a thickness of about 80 Å of the underlying Al are removed in this additional 10-second etching process. $Al_2O_3$ thus has a lower etch rate than Al when dilute HF solution is used. Accordingly, by forming an alumina layer on top of the aluminum layer, the amount of the aluminum material removed by the wet etching process can be significantly reduced.

In the wet etching process, concentration of HF solution and etching time can be controlled to ensure removal of the interfacial oxide layer 240 and the $Al_2O_3$ top layer 270 and, meanwhile, to minimize or avoid unduly damage of the Al top layer 220. In a specific embodiment, an $Al_2O_3$ layer 270 having a thickness of 5 Å to 200 Å can be etched away by a HF solution with a concentration of about 0.5 mol/kg to 0.01 mol/kg for an etching time of about 1 second to about 300 seconds.

Referring back to FIG. 12, as the interfacial oxide layer 240 is removed, an opening 280 is formed to expose the high-k dielectric layer 230. Optionally, following the wet etching process, the device shown in FIG. 12 can be washed with deionized water for about 1-60 seconds to remove residual chemicals.

Figure 13:
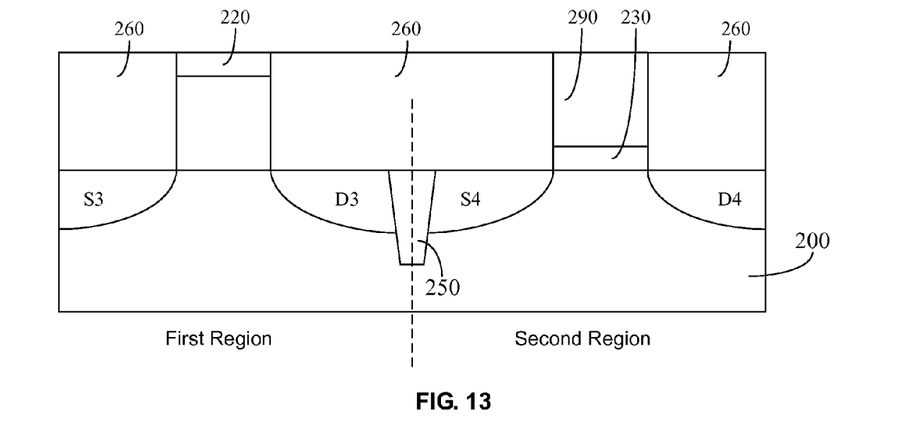

Referring to step S207 in FIG. 9, a metal gate can be formed after the removal of the interfacial oxide layer. FIG. 13 depicts a corresponding structure showing a metal gate 290 formed on the exposed high-k dielectric layer 230 in the opening 280.

The metal gate 290 for the exemplary NMOS transistor can be formed by depositing a corresponding metal material to fill the opening 280. A chemical mechanical polishing (CMP) process can then be performed to the entire surface of the CMOS device including the metal gate 220 of the PMOS transistor.

In this manner, a CMOS device can be formed including a metal gate structure of an NMOS (or PMOS) transistor. By oxidizing a metal top layer of the metal gate structure to form a metal oxide top layer there-on, the metal top layer of the metal gate structure can be protected without using a photoresist layer by photolithography. The formed metal oxide top layer can be removed when an interfacial oxide layer has to be removed from the dielectric layer of a PMOS (or NMOS) transistor of the CMOS device by a wet-etching process. The metal oxide top layer may protect the metal top layer from being etched or otherwise damaged during the wet-etching process. For example, a dilute HF solution has a lower etch rate to $Al_2O_3$ as compared to Al, thus less Al can be removed during this wet etching process. Moreover, it should be noted that the interfacial oxide layer is removed by a single oxidation process to form the metal oxide top layer and a single wet etching process to remove both and, thus, less process steps are used.

Figure 14:
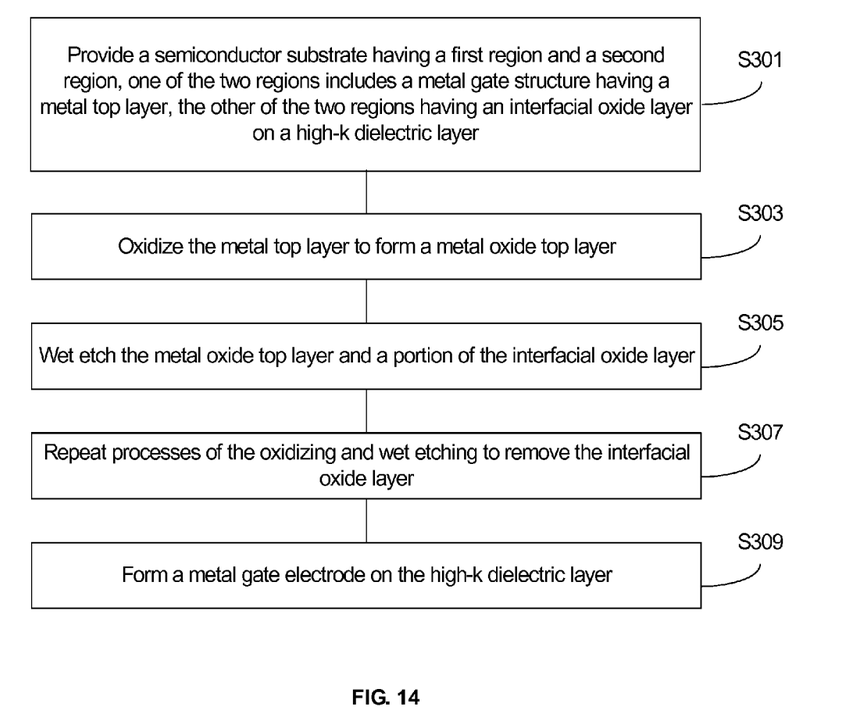
FIG. 14 is a schematic flow diagram showing another exemplary method for forming a CMOS device in accordance with various disclosed embodiments.

FIG. 14 depicts another exemplary fabrication process for forming a CMOS device, and FIGS. 15-21 depict exemplary semiconductor structures of the CMOS device corresponding to various stages of the fabrication process depicted in FIG. 14.

Figure 15:
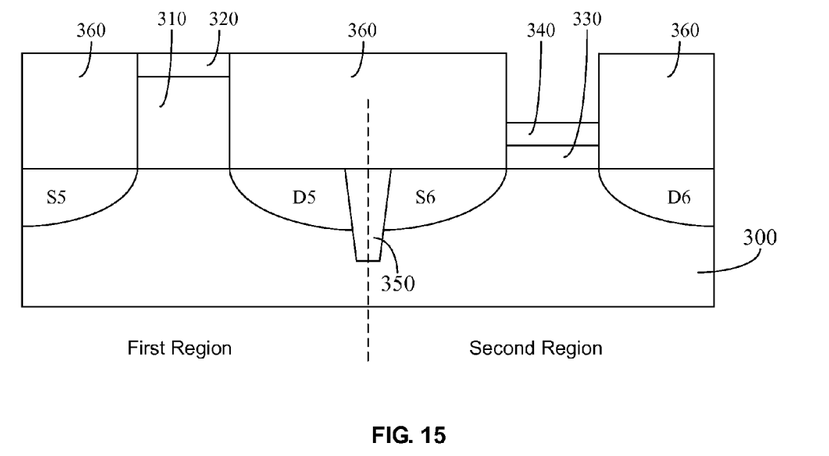
FIG. 15 through FIG. 21 are schematics of another exemplary CMOS device at various stages during formation in accordance with various disclosed embodiments.

At step S301 of FIG. 14 and referring to a corresponding structure shown in FIG. 15, a semiconductor substrate 300 can be provided, and the semiconductor substrate 300 can include a first region, e.g., for forming a PMOS transistor, and a second region, e.g., for forming an NMOS transistor. The first region (e.g., for forming a PMOS transistor) can include a source region S5 and a drain region D5. The second region (e.g., for forming an NMOS transistor) can include a source region S6 and a drain region D6. An isolation structure 350 can be formed between the first region and the second region. The isolation structure 350 can include a shallow trench isolation structure, or any other isolation structures. A dielectric layer 360 can also be formed on the substrate 300.

As shown in FIG. 15, a metal gate structure 310 has been formed in the first region. The already-formed metal gate structure 310 may include, for example, a high-k dielectric layer (not illustrated), a work function layer (not illustrated), and a metal top layer, such as an aluminum (Al) top layer 320.

In the second region of FIG. 15, an interfacial oxide layer 340 has been formed on a high-k dielectric layer 330. Generally, the interfacial oxide layer 340 may include any possible oxide material generated during device fabrication. The present disclosure will be described using silicon oxide as an example. The interfacial oxide layer 340 is undesired and needs to be removed before forming any metal gate over the high-k dielectric layer 330. A protection layer may need to be formed to cover the Al top layer 320 when the interfacial oxide layer 340 is being processed (e.g., removed). Note that the structure shown in FIG. 15 may be the same or different than the structure shown in FIG. 10.

Figure 16:
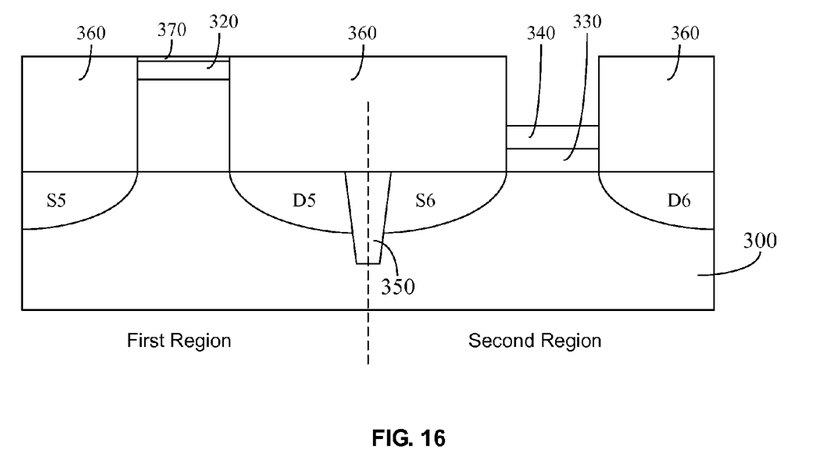

At step S303 of FIG. 14, and referring to a corresponding structure shown in FIG. 16, an oxide top layer such as an $Al_2O_3$ top layer 370 is formed by oxidizing the Al top layer 320. The oxidization process can be conducted similarly to the oxidization process as depicted in step S203 of FIG. 9. The resulting $Al_2O_3$ top layer 370 can be the same or different than the $Al_2O_3$ top layer 270.

Figure 17:
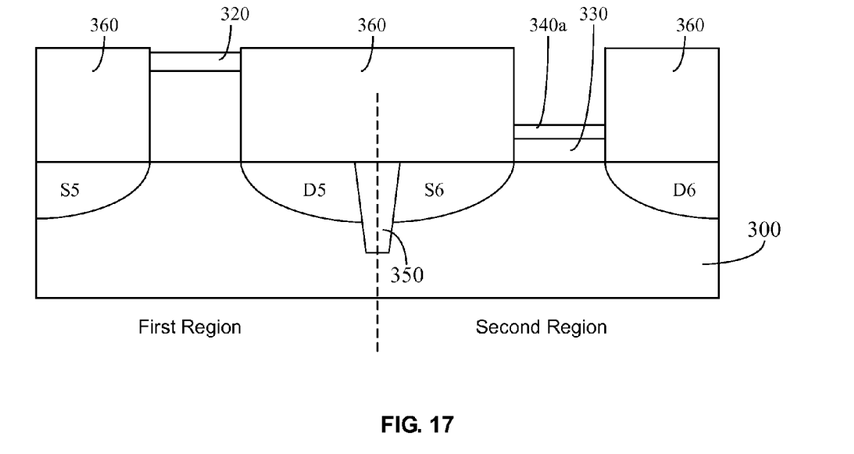

At step S305 of FIG. 14, and referring to a corresponding structure shown in FIG. 17, the $Al_2O_3$ top layer 370 and a portion of the interfacial oxide layer 340 are removed using a wet etching process to expose the Al top layer 320 in the first region and to leave remaining interfacial oxide layer 340a in the second region. The wet etching process can use a dilute HF solution as an etching agent, as depicted in FIG. 9.

Figure 18:
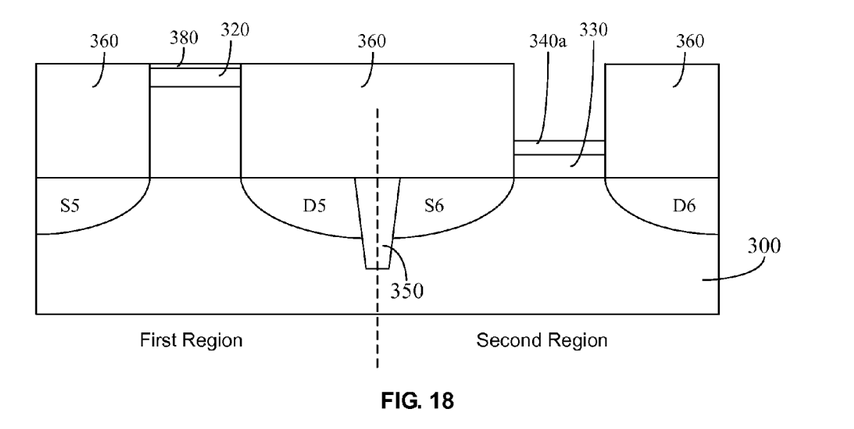
Figure 19:
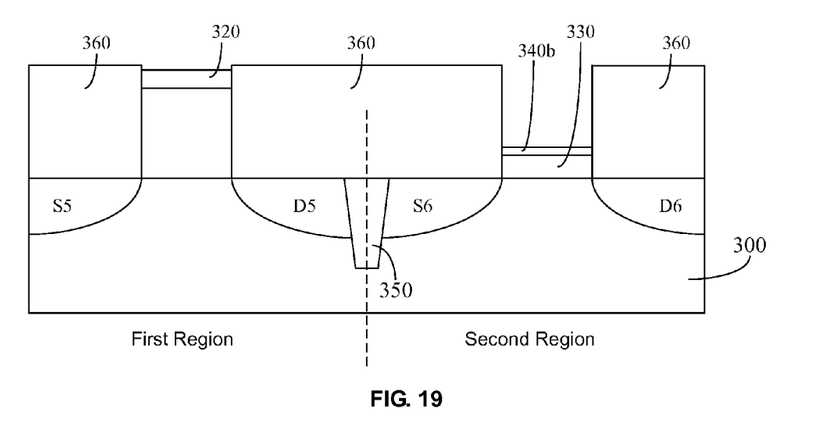
Figure 20:
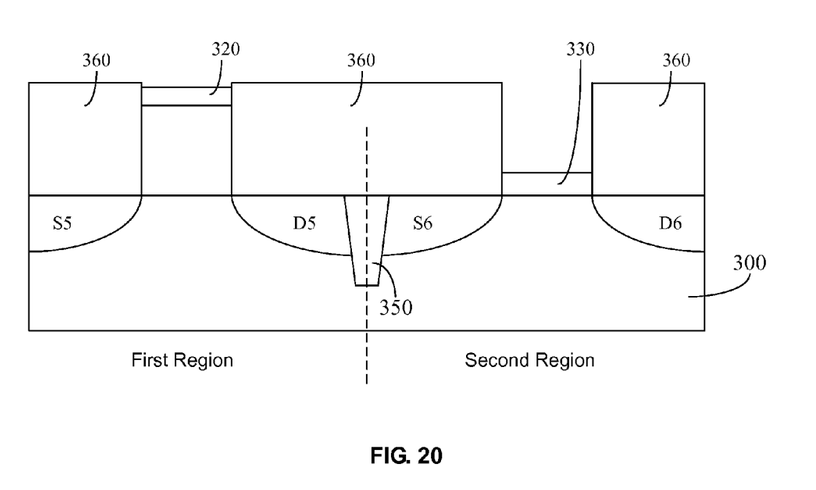

At step S307 of FIG. 14, step S303 and S305 can be repeated so as to remove the interfacial oxide layer 340 by multiple steps. Corresponding structures are shown in FIGS. 18-20. In particular, the surface of Al top layer 320 can be oxidized to form a second $Al_2O_3$ top layer 380 on the Al top layer 320, as shown in FIG. 18. The second $Al_2O_3$ top layer 380 and another portion of the remaining interfacial oxide layer 340a can be removed, leaving another remaining interfacial oxide layer 340b with a further reduced thickness, as shown in FIG. 19. Such processing cycle including an oxidization process to create an oxidized metal top layer and a removal process to remove the oxidized metal top layer along with a portion of the metal oxide layer can be repeated until the interfacial oxide layer 340 is completely removed, as shown in FIG. 20.

As describe above, the metal oxide top layer can have a controllable thickness depending on the oxidization temperature and/or time, while the amount of the interfacial oxide layer removed by dilute HF solution may depend on the concentration of the HF solution and/or etching time. It may be determined that the more times the processing cycles are repeated, the less the removal of the interfacial oxide layer in the second region will affect the metal top layer of the metal gate structure in the first region. It may be desired that each processing cycle removes a small amount of interfacial oxide layer.

In certain embodiments, following each wet etching process, deionized water can be used to wash the device, e.g., for about 1 second to about 60 seconds, to remove residues on the device.

Figure 21:
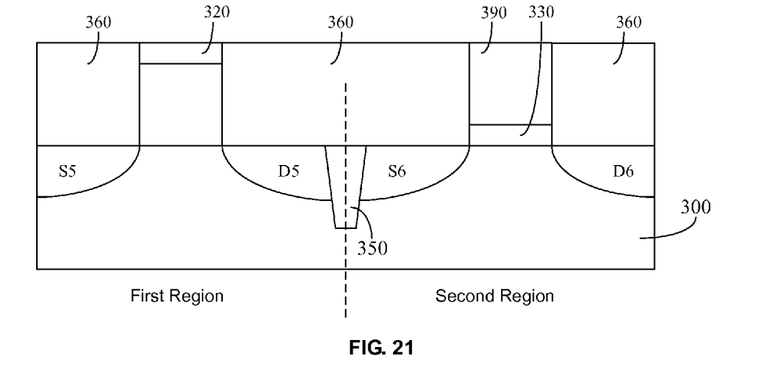

Referring back to FIG. 14, at step S309, and referring to a corresponding structure shown in FIG. 21, a metal gate 390 can be formed on the high-k dielectric layer 330. Further, other structures may be formed on top of the metal gate structures.

In this manner, by oxidizing the top metal (e.g., Al) layer to form a dense metal oxide ($Al_2O_3$) layer, the top metal layer can be protected by the metal oxide layer without any photoresist films. When the interfacial oxide layer is etched, less metal material is removed. Thus, by using the disclosed methods for forming CMOS devices, when the interfacial oxide layer is being processed, no photoresist layers are used. Manufacturing cost can be reduced. The removal of interfacial oxide layer does not unduly damage the surrounding structure including the metal gate structure.

In addition, by repeating cycles of oxidation of metal top layer and etching of portions of the interfacial oxide layer and the oxidized metal top layer, the entire interfacial oxide layer can be removed by multiple steps/cycles. The etching time of each step/cycle can be reduced. Metal top layer under the metal oxide top layer may be less likely affected due to over-etching.

The processing cycles of oxidation and wet etching can be performed in various ways. For example, in one embodiment, three repeating cycles of oxidation process and wet etching process can be preformed. Each oxidation process can be performed at a temperature ranging from 0° C. to about 300° C. for a time length ranging from about 1 second to about 300 seconds. An $Al_2O_3$ top layer having a thickness ranging from about 5 Å to 100 Å was then formed. Accordingly, each etching process uses an HF solution having a concentration ranging from about 0.5 mol/kg to about 0.005 mol/kg, for about 2 seconds to about 100 seconds, to remove a portion of the interfacial oxide layer with a thickness ranging from about 2.5 Å to about 4 Å.

In another embodiment, five repeating cycles of oxidation and wet etching process can be preformed. Each oxidation process can be performed at a temperature ranging from 0° C. to about 300° C. for a time length ranging from about 1 second to about 200 seconds. An $Al_2O_3$ top layer having a thickness ranging from about 5 Å to 50 Å was then formed. Accordingly, each etching process uses a dilute HF solution having a concentration ranging from about 0.5 mol/kg to about 0.005 mol/kg for about 1 second to about 80 seconds to remove a portion of the interfacial oxide layer with a thickness ranging from about 1.5 Å to about 3 Å.

In another embodiment, seven repeating cycles of oxidation and wet etching process can be preformed. Each oxidation process can be performed at a temperature ranging from 0° C. to about 300° C. for a time length ranging from about 1 second to about 100 seconds. An $Al_2O_3$ top layer having a thickness ranging from about 4 Å to 40 Å was then formed. Accordingly, each etching process uses a dilute HF solution having a concentration ranging from about 0.5 mol/kg to about 0.005 mol/kg for about 1 second to about 80 seconds to remove a portion of the interfacial oxide layer with a thickness ranging from about 1.2 Å to about 1.8 Å.

In another embodiment, ten repeating cycles of oxidation and wet etching process can be preformed. Each oxidation process can be performed at a temperature ranging from 0° C.

to about 300° C. for a time length ranging from about 1 second to about 60 seconds. An $Al_2O_3$ top layer having a thickness ranging from about 5 Å to 30 Å was then formed. Accordingly, each etching process uses an HF solution having a concentration ranging from about 0.5 mol/kg to about 0.005 mol/kg for about 1 second to about 30 seconds to remove a portion of the interfacial oxide layer with a thickness ranging from about 0.8 Å to about 1.2 Å.

In certain other embodiments, when 5-7 repeating cycles are performed, with suitable oxidation and etching conditions, the repeated processing cycles can achieve the removal of the interfacial oxide layer without affecting the aluminum top layer and with minimum processing time.

Other applications, advantages, alternations, modifications, or equivalents to the disclosed embodiments are obvious to those skilled in the art.

What is claimed is:

1. A method of forming a complementary metal-oxide-semiconductor (CMOS) device comprising:
   providing a semiconductor substrate including a first region to form a PMOS transistor and a second region to form an NMOS transistor, the first region including a metal gate structure including a metal top layer of a metal gate, the second region including an interfacial oxide layer formed on a high-k dielectric layer;
   oxidizing a surface of the metal top layer in the first region to form a metal oxide top layer covering a remaining metal top layer;
   wet etching in a same step to simultaneously remove the metal oxide top layer in the first region and the interfacial oxide layer in the second region, to expose the remaining metal top layer as the metal gate in the first region and to expose the high-k dielectric layer in the second region; and
   forming a metal gate on the high-k dielectric layer that has been exposed in the second region.

2. The method of claim 1, wherein the wet etching includes one single wet etching process to entirely remove the interfacial oxide layer.

3. The method of claim 1, wherein steps of the oxidizing and the wet etching are repeated until the high-k dielectric layer is exposed in the second region, and wherein the repeated process includes:
   oxidizing the surface of the metal top layer to form a first metal oxide top layer;
   wet etching in a same step to simultaneously remove the first metal oxide top layer and a first portion of the interfacial oxide layer to expose the remaining metal top layer as the metal gate in the first region and to expose a remaining interfacial oxide layer in the second region;
   oxidizing a surface of the remaining metal top layer to form a second metal oxide top layer; and
   wet etching in a same step to simultaneously remove the second metal oxide top layer and a second portion of the remaining interfacial oxide layer.

4. The method of claim 1, wherein the oxidizing of the surface of the metal top layer includes passing a gas mixture containing oxygen and nitrogen to the metal top layer formed of aluminum (Al) when heated, such that the oxygen reacts with the surface of the metal top layer to form a metal oxide top layer of alumina ($Al_2O_3$).

5. The method of claim 1, wherein the interfacial oxide layer is formed of silicon oxide and the wet etching uses dilute hydrofluoric acid (HF) solution as an etchant.

6. The method of claim 4, wherein steps of the oxidizing and wet etching are performed once, wherein the oxidizing step is performed at a temperature ranging from 0° C. to about 300° C. for about 1 second to about 600 seconds.

7. The method of claim 5, wherein steps of the oxidizing and wet etching are performed once, wherein the wet etching step uses the dilute HF solution having a concentration ranging from about 0.5 mol/kg to about 0.005 mol/kg for about 1 second to about 300 seconds.

8. The method of claim 4, wherein steps of the oxidizing and wet etching include three repeating cycles of the oxidizing and wet etching, and wherein the oxidizing step in each repeating cycle is performed at a temperature ranging from 0° C. to about 300° C. for about 1 second to about 300 seconds.

9. The method of claim 5, wherein steps of the oxidizing and wet etching include three repeating cycles of the oxidizing and wet etching, and wherein the wet etching step in each repeating cycle uses the dilute HF solution having a concentration ranging from about 0.5 mol/kg to 0.005 mol/kg for about 2 second to about 100 seconds.

10. The method of claim 4, wherein steps of the oxidizing and wet etching include five repeating cycles of the oxidizing and wet etching, and wherein the oxidizing step in each repeating cycle is performed at a temperature ranging from 0° C. to about 300° C. for about 1 second to about 200 seconds.

11. The method of claim 5, wherein steps of the oxidizing and wet etching include five repeating cycles of the oxidizing and wet etching, and wherein the wet etching step in each repeating cycle uses the dilute HF solution having a concentration ranging from about 0.5 mol/kg to 0.005 mol/kg for about 1 second to about 80 seconds.

12. The method of claim 4, wherein steps of the oxidizing and wet etching include seven repeating cycles of the oxidizing and wet etching, and wherein the oxidizing step in each repeating cycle is performed at a temperature ranging from 0° C. to about 300° C. for about 1 second to about 100 seconds.

13. The method of claim 5, wherein steps of the oxidizing and wet etching include seven repeating cycles of the oxidizing and wet etching, and wherein the wet etching step in each repeating cycle uses the dilute HF solution having a concentration ranging from about 0.5 mol/kg to 0.005 mol/kg for about 1 second to about 60 seconds.

14. The method of claim 4, wherein steps of the oxidizing and wet etching include ten repeating cycles of the oxidizing and wet etching, and wherein the oxidizing step in each repeating cycle is performed at a temperature ranging from 0° C. to about 300° C. for about 1 second to about 60 seconds.

15. The method of claim 5, wherein steps of the oxidizing and wet etching include ten repeating cycles of the oxidizing and wet etching, and wherein the wet etching step in each repeating cycle uses the dilute HF solution having a concentration ranging from about 0.5 mol/kg to 0.005 mol/kg for about 1 second to about 30 seconds.

16. The method of claim 1, further including washing the device with deionized water following the wet etching step for about 1 second to about 60 seconds.

17. The method of claim 2, further including:
   controlling a thickness of the metal oxide top layer determined based on a thickness of the interfacial oxide layer such that one single wet etching process entirely removes both the interfacial oxide layer and the metal oxide top layer.

18. The method of claim 3, further including:
   controlling a thickness of the first metal oxide top layer determined based on a thickness of a first portion of the interfacial oxide layer such that one single wet etching process removes both the first portion of the interfacial oxide layer and the metal oxide top layer entirely.

* * * * *